(12) United States Patent
Kim et al.

(10) Patent No.: US 12,308,227 B2
(45) Date of Patent: May 20, 2025

(54) EPITAXIAL GROWTH USING CARBON BUFFER ON SUBSTRATE

(71) Applicant: Massachusetts Institute of Technology, Cambridge, MA (US)

(72) Inventors: Jeehwan Kim, Cambridge, MA (US); Wei Kong, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 322 days.

(21) Appl. No.: 17/283,625

(22) PCT Filed: Oct. 16, 2019

(86) PCT No.: PCT/US2019/056428
§ 371 (c)(1),
(2) Date: Apr. 8, 2021

(87) PCT Pub. No.: WO2020/081623
PCT Pub. Date: Apr. 23, 2020

(65) Prior Publication Data
US 2021/0351033 A1    Nov. 11, 2021

Related U.S. Application Data

(60) Provisional application No. 62/746,072, filed on Oct. 16, 2018.

(51) Int. Cl.
*H01L 21/02* (2006.01)
(52) U.S. Cl.
CPC .. *H01L 21/02293* (2013.01); *H01L 21/02378* (2013.01); *H01L 21/02444* (2013.01); *H01L 21/0254* (2013.01); *H01L 21/02598* (2013.01)
(58) Field of Classification Search
CPC ............... H01L 21/02293; H01L 21/02378
See application file for complete search history.

(56) References Cited

U.S. PATENT DOCUMENTS

| 10,770,289 B2 | 9/2020 | Kim |
| 2010/0320445 A1 | 12/2010 | Ogihara et al. |

(Continued)

FOREIGN PATENT DOCUMENTS

| CN | 103117317 A | 5/2013 |
| CN | 103378223 A | 10/2013 |

(Continued)

OTHER PUBLICATIONS

Extended European Search Report for Application No. 19872794.3 mailed Jun. 14, 2022.

(Continued)

*Primary Examiner* — Nicholas J Tobergte
*Assistant Examiner* — Adin Hrnjic
(74) *Attorney, Agent, or Firm* — Wolf, Greenfield & Sacks, P.C.

(57) ABSTRACT

Apparatus, systems, and methods for forming semiconductor materials (e.g., using nanofabrication) are generally described. In one example, a method comprises formation of a carbon buffer layer on a first substrate and a graphene layer on the carbon buffer layer, followed by removing the graphene layer so as to expose the carbon buffer layer and form a fabrication platform, and after removing the graphene layer, forming a first epitaxial layer directly on the carbon buffer layer covalently bonded to the first substrate, wherein the first epitaxial layer comprises a semiconductor. In one example, a method comprises forming an epitaxial layer directly on a carbon buffer layer that is covalently bonded to a substrate, wherein the epitaxial layer comprises a semiconductor, and wherein the carbon buffer layer is a pseudo-graphene layer.

15 Claims, 5 Drawing Sheets

(56) References Cited

U.S. PATENT DOCUMENTS

| | | | |
|---|---|---|---|
| 2012/0141799 A1 | 6/2012 | Kub et al. | |
| 2013/0288464 A1 | 10/2013 | Wei et al. | |
| 2014/0110662 A1* | 4/2014 | Duan | B32B 9/005 257/12 |
| 2014/0220764 A1 | 8/2014 | Bayram et al. | |
| 2014/0291282 A1* | 10/2014 | Bedell | H01L 21/02002 216/2 |
| 2014/0342127 A1* | 11/2014 | Dimitrakopoulos | H01L 23/53276 428/172 |
| 2015/0084074 A1 | 3/2015 | Bayram et al. | |
| 2018/0197736 A1 | 7/2018 | Kim | |

FOREIGN PATENT DOCUMENTS

| | | |
|---|---|---|
| CN | 103985628 A | 8/2014 |
| CN | 108140552 A | 6/2018 |
| JP | 2018-535536 A | 11/2018 |
| WO | WO 2014/190352 A1 | 11/2014 |
| WO | WO 2017/044577 A1 | 3/2017 |

OTHER PUBLICATIONS

International Search Report from International Patent Application No. PCT/US2019/056428, mailed Jan. 3, 2020.
Written Opinion of the International Search Authority from International Patent Application No. PCT/US2019/056428, mailed Jan. 3, 2020.
Chinese Office Action for Application No. 201980067491.2, mailed Jan. 20, 2023.
International Preliminary Report on Patentability for International Patent Application No. PCT/US2019/056428, mailed Apr. 29, 2021.
Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.
Kim et al., 9.4% efficient amorphous silicon solar cell on high aspect-ratio glass microcones. Adv Mater. Jun. 2014;26(24):4082-6. Epub Mar. 20, 2014.
Kim et al., High efficiency Cu2ZnSn(S,Se)4 solar cells by applying a double In2S3/CdS emitter. Adv Mater. Nov. 2014;26(44):7427-31. Epub Aug. 25, 2014.
Kim et al., Fabrication of dislocation-free tensile strained Si thin films using controllably oxidized porous Si substrates. Appl Phys Lett. 2006;89(15):152117(1-3). Epub Oct. 12, 2006.
Kim et al., A method for fabricating dislocation-free tensile-strained SiGe films via the oxidation of porous Si substrates. Appl Phys Lett. 2007;91(25):252108(1-3). Epub Dec. 19, 2007.
Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.
Kim et al., Principle of direct van der Waals epitaxy of single-crystalline films on epitaxial graphene. Nat Commun. Sep. 2014;5:4836. doi:10.1038/ncomms5836, 7 pages.
Kim et al., Layer-resolved graphene transfer via engineered strain layers. Science. Nov. 15, 2013;342(6160):833-6.
Kim et al., Remote epitaxy through graphene enables two-dimensional material-based layer transfer. Nature. Apr. 20, 2017;544(7650):340-3. doi: 10.1038/nature22053. Methods included. 12 pages total.
Kong et al., Polarity governs atomic interaction through two-dimensional materials. Nat Mater. Nov. 2018;17:999-1005.
Chinese Office Action for Application No. 201980067491.2, mailed Jul. 5, 2022.
Chinese Decision on Rejection mailed Aug. 9, 2023, for Application No. CN201980067491.2.
Japanese Office Action mailed Nov. 27, 2023, for Application No. JP2021-520542.
Japanese Notice of Reasons for Rejection mailed Sep. 3, 2024, for Application No. 2021-520542.
Korean Notice of Preliminary Rejection mailed Oct. 24, 2024, for Application No. 10-2021-7014717.
KR 10-2021-7014717, Oct. 24, 2024, Korean Notice of Preliminary Rejection.
JP2021-520542, Sep. 3, 2024, Notice of Reasons for Rejection.

\* cited by examiner

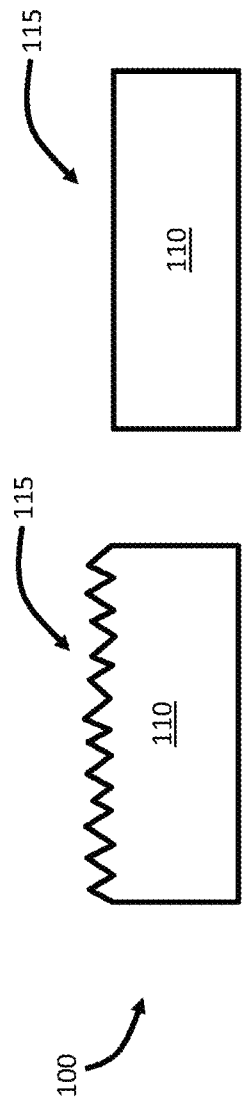

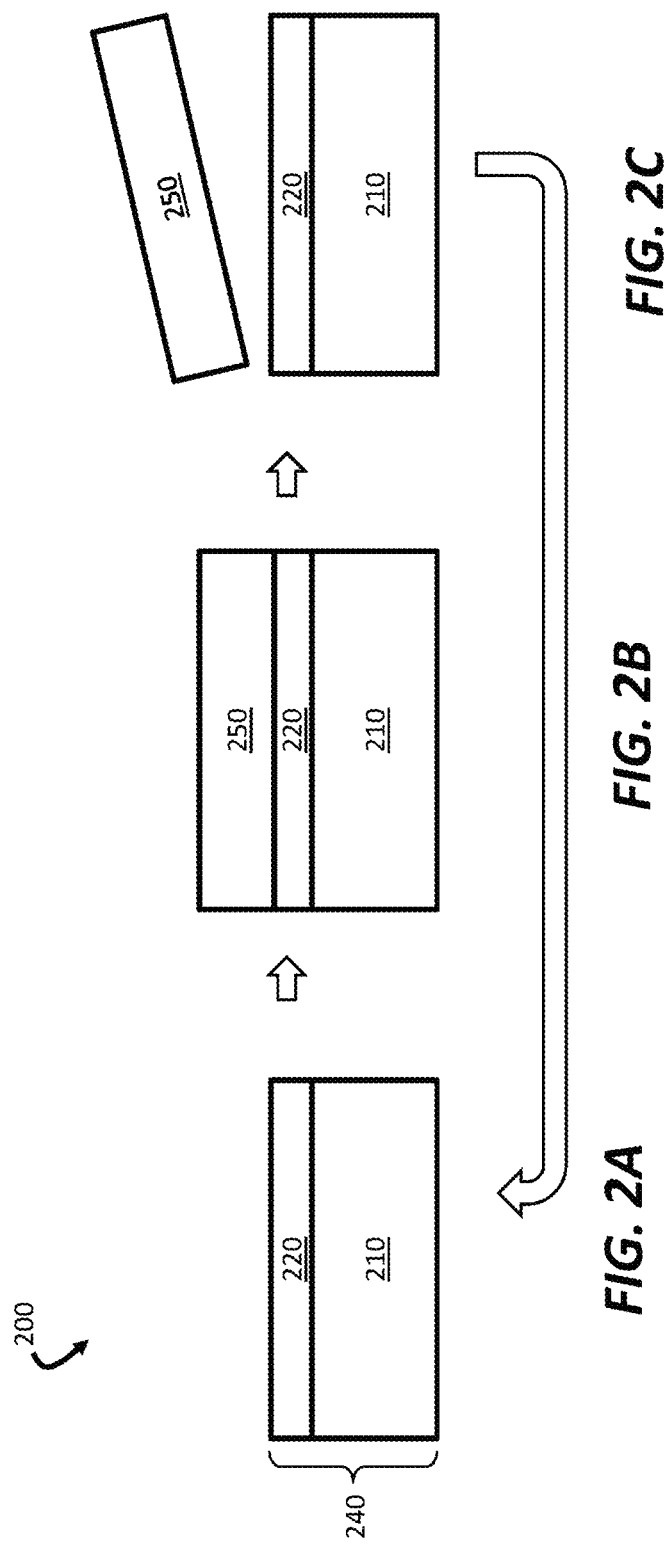

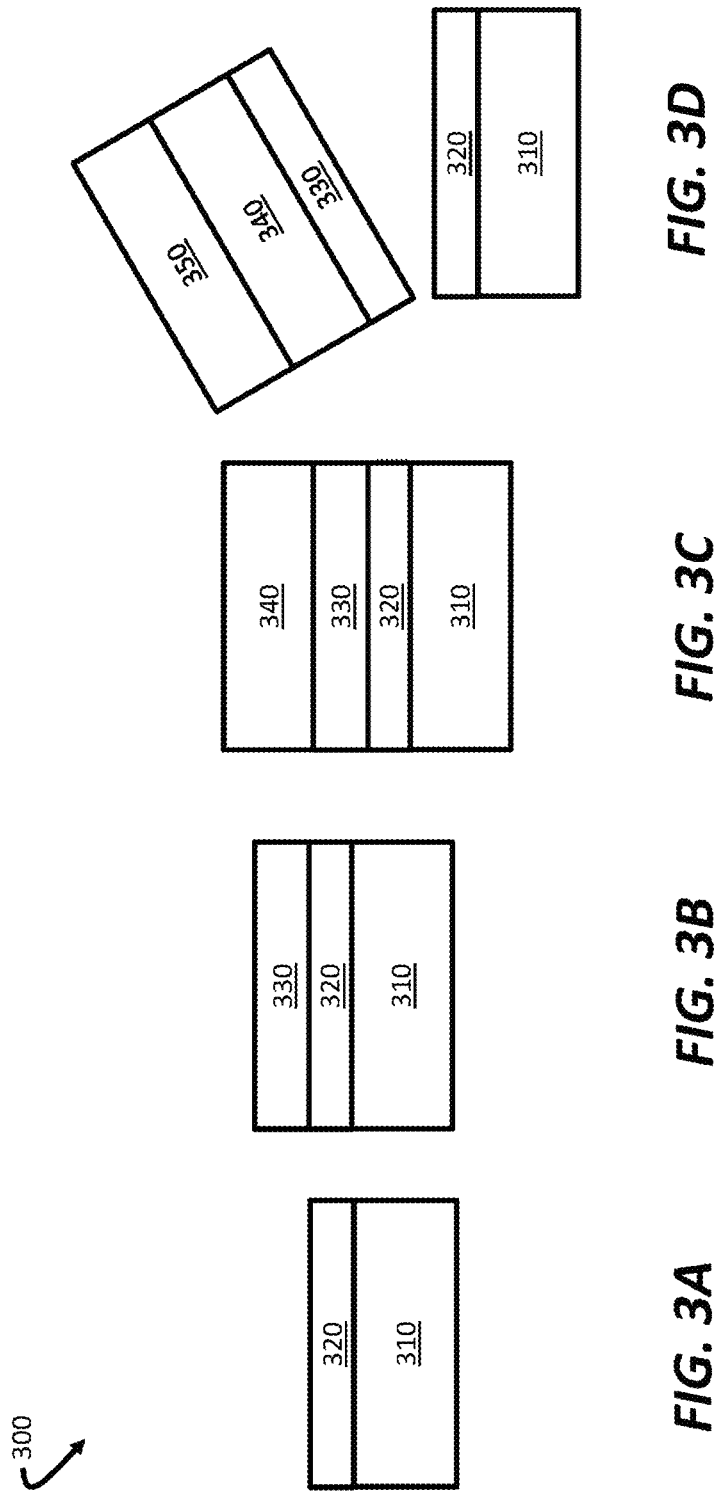

EPITAXIAL GROWTH USING CARBON BUFFER ON SUBSTRATE

RELATED APPLICATIONS

This application is a national stage filing under 35 U.S.C. § 371 of International Patent Application No. PCT/US2019/056428, filed Oct. 16, 2019, and entitled "Epitaxial Growth Template Using Carbon Buffer on Sublimated SiC Substrate," which claims priority under 35 U.S.C. § 119 (e) to U.S. Provisional Application No. 62/746,072, filed Oct. 16, 2018, and entitled "Epitaxial Growth Template Using Carbon Buffer on Sublimated SiC Substrate," each of which is incorporated herein by reference in its entirety for all purposes.

TECHNICAL FIELD

Apparatus, systems, and methods for forming semiconductor materials (e.g., using nanofabrication) are generally described.

BACKGROUND

In advanced electronic and photonic technologies, devices are usually fabricated from functional semiconductors, such as III-N semiconductors, III-V semiconductors, II-VI semiconductors, and Ge. The lattice constants of these functional semiconductors typically do not match the lattice constants of silicon substrates. As understood in the art, lattice constant mismatch between a substrate and an epitaxial layer on the substrate can introduce strain into the epitaxial layer, thereby preventing epitaxial growth of thicker layers without defects. Therefore, non-silicon substrates are usually employed as seeds for epitaxial growth of most functional semiconductors. However, non-Si substrates with lattice constants matching those of functional materials can be costly and therefore limit the development of non-Si electronic/photonic devices.

SUMMARY

Embodiments of the present invention include apparatus, systems, and methods for nanofabrication. In one example, a method of manufacturing a semiconductor device includes formation of a carbon buffer layer on the first substrate and a graphene layer on the carbon buffer layer by silicon sublimation. The method also includes removing the graphene layer so as to expose the carbon buffer layer and form a fabrication platform.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1D illustrate a method of fabricating a semiconductor device using a layer transfer technique, in accordance with some embodiments.

FIGS. 2A-2C illustrate a method of fabricating a semiconductor device using a fabrication platform fabricated via the method illustrated in FIGS. 1A-1D, in accordance with some embodiments.

FIGS. 3A-3F illustrate a method of pseudo-graphene-based layer transfer, in accordance with some embodiments.

DETAILED DESCRIPTION

Figure 3F:
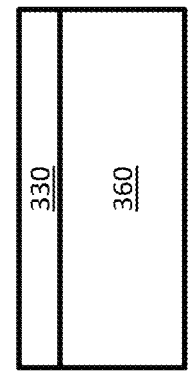

One method to address the high cost of non-silicon substrates is the "layer-transfer" technique, in which functional device layers are grown on lattice-matched substrates and then removed and transferred to other substrates. The remaining lattice-matched substrates can then be reused to fabricate another device layer, thereby reducing cost. To significantly reduce manufacturing costs, it can be desirable for a layer-transfer method to have the following properties: 1) substrate reusability; 2) a minimal substrate refurbishment step after the layer release; 3) a fast release rate; and 4) precise control of release thickness.

Conventional methods to remove and transfer a device layer from a lattice-matched substrate include chemical lift-off (also referred to as epitaxial lift-off or ELO), optical lift-off (also referred to as laser lift-off or LLO), and mechanical lift-off (also referred to as controlled spalling). Unfortunately, none of these methods has all of the four desired properties noted above.

The chemical lift-off technique can be used for lifting off device layers made of III-V semiconductors from GaAs wafers. A sacrificial layer of AlAs is usually epitaxially inserted between the device layer and the substrate. The chemical lift-off technique selectively etches the sacrificial layer in a wet-chemical solution to release the device layers.

Despite its continuous development over the last three decades, chemical lift-off still has several disadvantages. For example, the release rate is slow owing to slow penetration of chemical etchant through the sacrificial layer (e.g., typically a few days to release a single 8-inch wafer). Second, etching residues tend to become surface contamination after release. Third, chemical lift-off has limited reusability owing to the chemical mechanical planarization (CMP) performed after release to recover the roughened substrate surface into an epi-ready surface. Fourth, it can be challenging to handle released epilayers in the chemical solution.

The optical lift-off technique usually uses a high-power laser to irradiate the back of the lattice-matched substrate (e.g., a transparent sapphire or SiC substrate) and selectively heat the device-substrate interface, causing decomposition of the interface and release of the device layer (e.g., III-N film). This technique can reduce the cost of manufacturing III-N-based light emitting diodes (LEDs) and address the problem of heat accumulation from the device by transferring released III-Ns to a substrate that has high thermal conductivity.

However, optical lift-off has its own limitations. First, because the molten III-N/substrate interface can make the substrate rough, a reconditioning step is usually carried out before reuse, thereby reducing the reusability to less than five times. Second, local pressurization at the interface caused by high-power thermal irradiation can induce cracks or dislocations. Third, the laser scanning speed can be too slow to permit high-throughput.

Controlled spalling can have a higher throughput than optical lift-off. In this technique, high-stress films (also referred to as "stressors") are deposited on the epitaxial film, inducing fracture below the epilayers and resulting in the separation of active materials from the substrate. When sufficient tensile stress is applied to the interface, a $K_{II}$ shear mode can initiate a crack and a $K_I$ opening mode can allow the propagation of the crack parallel to the interface between the epilayer and the substrate. By controlling the internal stress and thickness of the stressor, strain energy sufficient to reach the critical $K_I$ value can be provided, leading to fracture of the film/substrate interface. Because the exfoliation occurs via crack propagation, the spalling process can cause rapid release of films.

However, controlled spalling is not mature enough to be used for commercial manufacturing for at least the following reasons. First, because crack propagation generally occurs through cleavage planes that are not always aligned normal to the surface, the surface may need polishing for reuse. Second, a thick stressor is usually used to provide enough energy to separate strong covalent bonds, particularly when working with high Young's modulus materials like III-N semiconductors. Third, the internal stress of the stressor may only be controlled in a narrow range, which constrains the achievable thickness of the resulting spalled film. For example, because the maximum internal stress in a typical Ni stressor is about 1 GPa, the critical Ni thickness under 1 GPa tensile stress to initiate spalling of a GaAs film is about 1.5 μm, which can induce spalling of the GaAs film itself if the GaAs is about 10 μm thick. Therefore, when using a Ni stressor it can be challenging to make a GaAs film less than 10 μm thick, but typically most devices use films that are much thinner.

Systems and methods described herein, in accordance with certain embodiments, employ a pseudo-graphene-based layer transfer approach to fabricate devices. This approach can address one or more of the shortcomings in the above mentioned layer-transfer methods. In certain embodiments, functional devices are fabricated on a carbon buffer layer (also referred to as a pseudo-graphene layer), which in turn is formed on a SiC substrate. The fabricated functional devices can then be removed from the lattice-matched substrate via, for example, a stressor attached to the functional devices.

In certain embodiments, the carbon buffer layer serves as a reusable and universal platform for growing device layers and also serves a release layer that allows fast, precise, and repeatable release at the graphene surface. Compared to conventional methods, the approach described herein can provide one or more advantages. First, the weak interaction between the carbon buffer layer and the device layer can substantially relax the lattice mismatching rule for epitaxial growth, potentially permitting the growth of most semiconducting films with low defect densities. Second, the epilayer (e.g., functional devices) grown on the carbon buffer layer can be easily and precisely released from the substrate owing to the weak van der Waals interactions between the carbon buffer layer and the epilayer, which permits rapid mechanical release of epilayers without post-release reconditioning of the released surface. Third, the carbon buffer layer is usually mechanically robust and therefore can be highly reusable for multiple growth/release cycles.

FIGS. 1A-1D illustrate a method 100 of fabricating a semiconductor device via a pseudo-graphene layer transfer technique, in accordance with some embodiments. FIG. 1A shows a first substrate 110 (e.g., an SiC substrate) having a first surface 115, which might be unpolished. In some embodiments, first surface 115 can be characterized by a surface roughness substantially equal to or greater than about 100 nm (e.g., about 100 nm, about 200 nm, about 500 nm, or greater, including any values and sub ranges in between).

FIG. 1B shows that first surface 115 of first substrate 110 is planarized. For example, a chemical-mechanical planarization (CMP) process and/or high temperature hydrogen etching can be employed to decrease the surface roughness of the first substrate. In FIG. 1C, the topmost silicon layer is sublimated, and a carbon buffer layer 120 is formed on first substrate 110 so as to form a graphene layer 130 on the carbon buffer layer 120 (also referred to as a layer formation step). In accordance with certain embodiments, graphene layer 130 can interact with carbon buffer layer 120 via van der Waals forces. In some embodiments, carbon buffer layer 120 can be formed during the early stage of the growth of graphene layer 130. The carbon buffer layer 120 can include, for example, carbon clusters and/or carbon networks. In some embodiments, carbon buffer layer 120 comprises a crystalline structure. The crystalline structure can be the same as or similar to graphene, in certain embodiments. In some embodiments, the carbon buffer layer is covalently bonded to the underlying substrate. For example, in some embodiments, carbon buffer layer 120 can be covalently bonded to first surface 115 of substrate 110.

In FIG. 1D, the graphene layer 130 is removed from the carbon buffer layer 120, therefore forming a platform 140 including first substrate 110 and carbon buffer layer 120. Platform 140 can be used and reused to fabricate various types of semiconductor devices (as shown with more detail in FIGS. 2A-2C and related description below). Compared to graphene layer 130, carbon buffer layer 120 has stronger bonding with underlying substrate 110, thereby allowing more stable device fabrication in subsequent processing.

The layer formation step illustrated in FIG. 1C can be carried out via various methods. In some embodiments, graphene layer 130 can include an epitaxial graphene with a single-crystalline orientation and substrate 110 can include a (0001) 4H—SiC wafer with a silicon surface. The fabrication of graphene layer 130 can include multistep annealing steps. A first annealing step can be performed in $H_2$ gas for surface etching, and a second annealing step can be performed in Ar for graphitization at high temperature (e.g., at least about 1000° C., such as about 1,575° C., or higher).

In some embodiments, carbon buffer layer 120 and graphene layer 130 can be grown on first substrate 110 via a chemical vapor deposition (CVD) process. Substrate 110 can include a nickel substrate or a copper substrate. Alternatively, substrate 110 can include an insulating substrate of $SiO_2$, $HfO_2$, $Al_2O_3$, $Si_3N_4$, and practically any other planar material compatible with high temperature CVD. In some embodiments, carbon buffer layer 120 and graphene layer 130 can be grown on first substrate 110 via a molecular-beam epitaxy (MBE) technique.

Various methods can also be used to remove graphene layer 130 from carbon buffer layer 120 and first substrate 110. For example, a carrier film can be attached to graphene layer 130. The carrier film can include a thick film of Poly(methyl methacrylate) (PMMA) or a thermal release tape, and the attachment can be achieved via a spin-coating process.

FIGS. 2A-2C illustrate a method 200 of fabricating an epilayer (e.g., which can be used to form part of a semiconductor device) using a fabrication platform fabricated via the method illustrated in FIGS. 1A-1D, in accordance with some embodiments. FIG. 2A shows a schematic of a fabrication platform 240 including a first substrate 210 and a carbon buffer layer 220 disposed on first substrate 210. The fabrication platform can be the same as or substantially similar to the fabrication platform 140 shown in FIG. 1D and described above. In FIG. 2B, an epilayer 250 is formed on carbon buffer layer 220 (e.g., via epitaxial growth or any other appropriate method). As described below, epilayer 250 can be epitaxially matched to carbon buffer layer 220 in some embodiments. Epilayer 250 can also, in some embodiments, be epitaxially matched to substrate 210.

In FIG. 2C, epilayer 250 is removed from the carbon buffer layer 220. For example, epilayer 250 can be transferred to another substrate for further processing. After removing epilayer 250, fabrication platform 240 can be employed for another round of fabrication (e.g., forming a second epilayer on carbon buffer layer 220).

Epilayer 250 can include a III-V semiconductor, Si, Ge, a III-N semiconductor, SiC, SiGe, or a II-VI semiconductor, among others. In one example, the lattice of first substrate 210 is matched to the lattice of epilayer 250, in which case first substrate 210 functions as the seed for the growth of the epilayer 250 if carbon buffer layer 220 is porous or thin enough. For example, in some cases, carbon buffer layer 220 comprises pores, and the material from which epilayer 250 is formed can contact underlying first substrate 210 through the pores, allowing first substrate to seed the growth of epilayer 250. As another example, the seeding of epilayer 250 by first substrate 210 can occur even when there is not direct contact between epilayer 250 and first substrate 210. For example, in accordance with certain embodiments, first substrate 210 may have a potential field (e.g., created by van der Waals forces and/or other atomic or molecular forces) and carbon buffer layer 220 may be so thin that the potential field of first substrate 210 reaches beyond carbon buffer layer 220 an interacts with the region within which epilayer 250 is formed. As a result, in some embodiments, the potential field from first substrate 210 affects the growth of epilayer 250.

Sandwiching carbon buffer layer 220 between first substrate 210 and epilayer 250 can facilitate quick and damage-free release and transfer of epilayer 250.

In another example, carbon buffer layer 220 may be thick enough (e.g., several layers thick) to function as a seed to grow epilayer 250, in which case epilayer 250 can be latticed-matched to carbon buffer layer 220. This example also allows repeated use of first substrate 210. In yet another example, first substrate 210 together with carbon buffer layer 220 can function as the seed to grow epilayer 250.

In one example, epilayer 250 includes a 2D material system. In another example, epilayer 250 includes a 3D material system. The flexibility to fabricate both 2D and 3D material systems allows fabrication of a wide range of optical, opto-electronic, and photonic devices known in the art.

The fabrication of epilayer 250 can be carried out using any of a variety of semiconductor fabrication techniques known in the art. For example, low-pressure Metal-Organic Chemical Vapor Deposition (MOCVD) can be used to grow epilayer 250 (e.g., a GaN film) on carbon buffer layer 220, which in turn is disposed on first substrate 210 (e.g., a SiC substrate). In this example, carbon buffer layer 220 and first substrate 210 can be baked (e.g., under $H_2$ for >15 min at >1,100° C.) to clean the surface. Then the deposition of epilayer 250 including GaN can be performed at, for example, 200 mbar. Trimethylgallium, ammonia, and hydrogen can be used as the Ga source, nitrogen source, and carrier gas, respectively. A modified two-step growth can be employed to obtain flat GaN epitaxial films on carbon buffer layer 220. The first step can be carried out at a growth temperature of 1,100° C. for a few minutes where guided nucleation at terrace edges can be promoted. The second growth step can be carried out at an elevated temperature of 1,250° C. to promote lateral growth. The vertical GaN growth rate in this case can be around 20 nm per min.

FIGS. 3A-3F illustrate a method 300 of layer transfer, in accordance with some embodiments. FIG. 3A shows that a carbon buffer layer 320 is formed on a donor wafer 310, which may be a single-crystalline wafer. For example, the carbon buffer layer 320 can be directly grown on the donor wafer 310, for example, using any of the methods described above with respect to FIGS. 1A-1D. FIG. 3B shows that an epilayer 330 is epitaxially grown on the carbon buffer layer 320. The epilayer 330 can include an electronic layer, a photonic layer, or any other functional device layer. Methods to fabricate the epilayer 330 can include any methods and techniques described above with respect to FIGS. 2A-2C.

FIG. 3C shows that a stressor 340 is disposed on epilayer 330. For example, stressor 340 can include a high-stress metal film such as a Ni film. In this example, the Ni stressor can be deposited in an evaporator at a vacuum level of $1 \times 10^{-5}$ Torr.

FIG. 3D shows that a tape layer 350 is disposed on stressor 340 for handling stressor 340. Using tape 350 and stressor 340 can mechanically exfoliate the epilayer 330 from carbon buffer layer 320 at a fast release rate by applying high strain energy to the interface between epilayer 330 and carbon buffer layer 320. The release rate can be fast at least due to the weak van der Waals bonding between carbon buffer layer 320 and other materials such as epilayer 330.

Figure 3E:
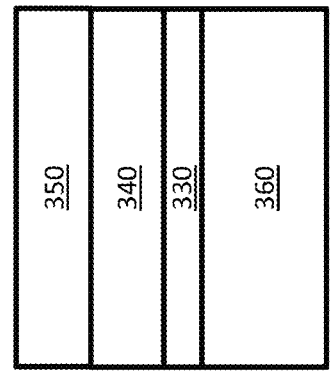

In FIG. 3E, released epilayer 330, together with stressor 340 and tape layer 350 are disposed on a host wafer 360. In FIG. 3F, tape 350 and stressor 340 are removed, leaving epilayer 330 for further processing such as forming more sophisticated devices or depositing additional materials on epilayer 330. In one example, tape layer 350 and stressor 340 can be etched away by a $FeCl_3$-based solution.

In the method 300, after the release of epilayer 330 shown in FIG. 3D, the remaining donor wafer 310 and carbon buffer layer 320 can be reused for the next cycle of epilayer fabrication. Alternatively, carbon buffer layer 320 can also be released. In this case, a new carbon buffer layer can be disposed and/or formed on donor wafer 310 before the next cycle of epilayer fabrication. In either case, carbon buffer layer 320 protects donor wafer 310 from damage, thereby allowing multiple uses and reducing cost. More details can be found in U.S. patent application Ser. No. 15/914,295, filed Mar. 7, 2018, published as U.S. Patent Application Publication No. 2018/0197736 on Jul. 12, 2018, and entitled "SYSTEMS AND METHODS FOR GRAPHENE BASED LAYER TRANSFER," which is incorporated herein by reference in its entirety.

Figure 4:
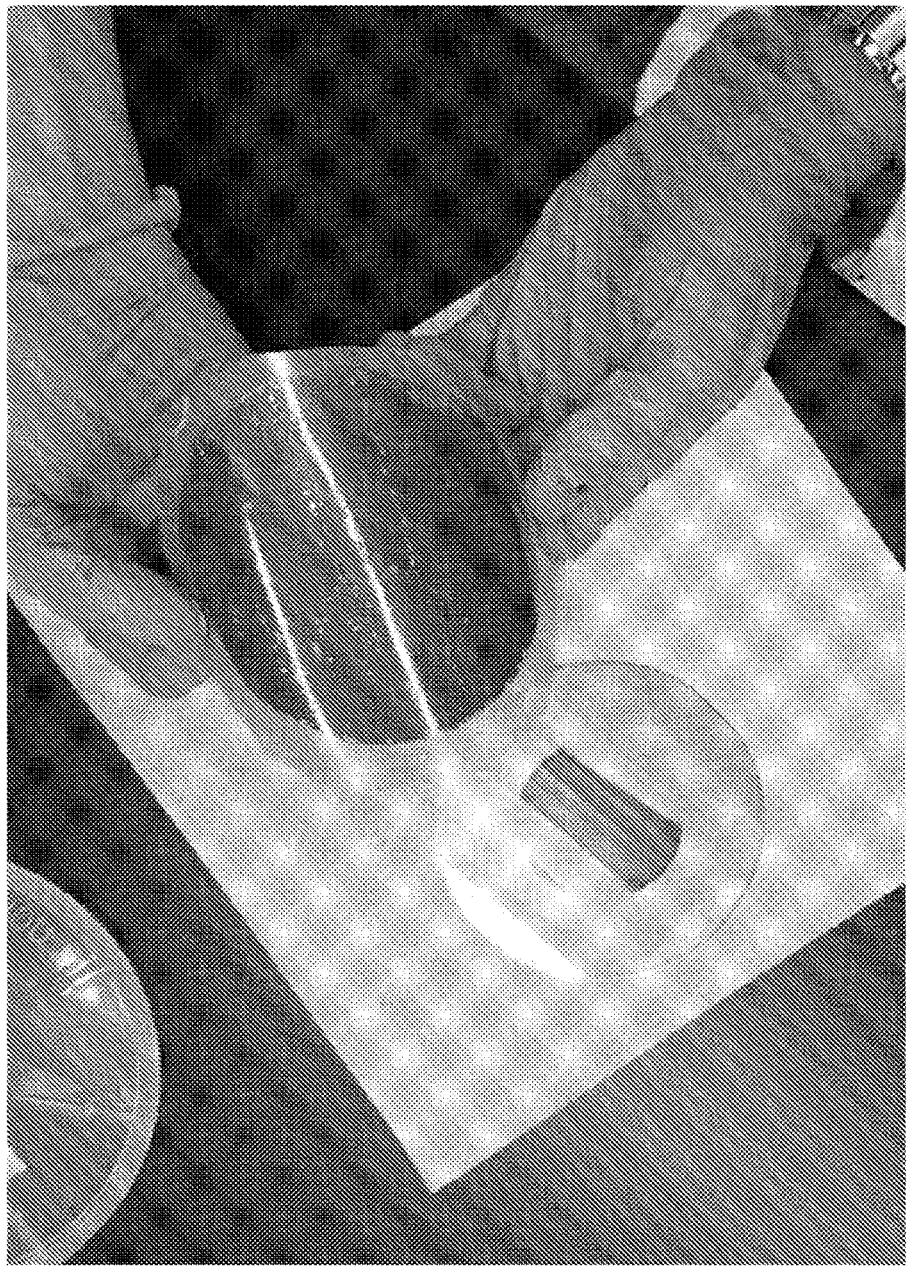
FIG. 4 is a photograph of a semiconductor material fabricated according to certain inventive methods.

FIG. 4 is a photograph of a GaN thin film that was epitaxially grown on a carbon buffer layer, after which the GaN thin film was removed from the surface of the carbon buffer layer via exfoliation using a flexible mechanical handler. Briefly, a 4-inch diameter (0001) 4H—SiC wafer was used as the substrate, with growth on a silicon face. The top surface of the SiC wafer was sublimated, and carbon buffer and graphene layers were grown, by first annealing in $H_2$ gas at 1,575° C., followed by a graphitization step in Ar at 1,575° C. The graphene layer (which was located over the carbon buffer layer and the substrate) was then removed using a mechanical release layer, leaving behind the carbon buffer layer on the SiC substrate. Subsequently, a GaN thin film was grown over the carbon buffer layer using MOCVD. Trimethylgallium, ammonia, and hydrogen were used in a two-step growth process, the first step conducted at 1,100° C. for a few minutes, and the second conducted at 1,250° C. The GaN thin film was subsequently exfoliated from the carbon buffer layer using a flexible mechanical handler. In FIG. 4, the GaN thin film is shown as a free-standing GaN thin film suspended on the flexible mechanical handler that was used to exfoliate the GaN from the carbon buffer layer and the substrate.

U.S. Provisional Application No. 62/746,072, filed Oct. 16, 2018, and entitled "Epitaxial Growth Template Using Carbon Buffer on Sublimated SiC Substrate" is incorporated herein by reference in its entirety for all purposes.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in another audible format.

Such computers may be interconnected by one or more networks in any suitable form, including a local area network or a wide area network, such as an enterprise network, an intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory media or tangible computer storage media) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationships between the fields. However, any suitable mechanism may be used to establish a relationship between information in fields of a data structure, including through the use of pointers, tags or other mechanisms that establish relationships between data elements.

Also, various inventive concepts may be embodied as one or more methods, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
   forming an epitaxial layer directly on a carbon buffer layer that is covalently bonded to a substrate,
   wherein the epitaxial layer comprises a semiconductor, and
   wherein the carbon buffer layer is a pseudo-graphene layer.

2. A method, comprising:
   forming a carbon buffer layer on a first substrate and a graphene layer on the carbon buffer layer, wherein the carbon buffer layer is covalently bonded to the first substrate;
   removing the graphene layer so as to expose the carbon buffer layer and form a fabrication platform; and
   after removing the graphene layer, forming a first epitaxial layer directly on the carbon buffer layer covalently bonded to the first substrate, wherein the first epitaxial layer comprises a semiconductor.

3. The method of claim 2, wherein the first substrate comprises silicon carbide and the graphene layer comprises a single-crystalline graphene layer.

4. The method of claim 1, further comprising transferring the epitaxial layer from the carbon buffer layer to a second substrate.

5. The method of claim 1, wherein forming the epitaxial layer comprises epitaxial growth of the epitaxial layer using the substrate as a seed,
   wherein:
   the carbon buffer layer comprises pores such that the substate seeds the epitaxial growth of the epitaxial layer through the pores; or
   the carbon buffer layer is thin such that a potential field of the substrate reaches beyond the carbon buffer layer and interacts with the epitaxial layer during the epitaxial growth of the epitaxial layer.

6. The method of claim 4, further comprising:
   forming a second epitaxial layer on the carbon buffer layer after transferring the epitaxial layer to the second substrate.

7. The method of claim 4, wherein transferring the epitaxial layer comprises exfoliating the epitaxial layer.

8. The method of claim 4, wherein transferring the epitaxial layer comprises:

forming a metal stressor on the epitaxial layer;
disposing a flexible tape on the metal stressor; and
pulling the epitaxial layer and the metal stressor off the carbon buffer layer with the flexible tape.

9. The method of claim 1, wherein the epitaxial layer comprises a III-V semiconductor, Si, Ge, SiC, SiGe, and/or a II-VI semiconductor.

10. The method of claim 4, wherein the epitaxial layer is manufactured into a semiconductor device.

11. A semiconductor device comprising the epitaxial layer formed by the method of claim 4.

12. The method of claim 1, wherein the epitaxial layer comprises a III-N semiconductor.

13. The method of claim 1, wherein the substrate comprises SiC.

14. The method of claim 1, wherein forming the carbon buffer layer on the first substrate and the graphene layer on the carbon buffer layer comprises sublimating a topmost surface of the first substrate.

15. The method of claim 14, wherein forming the carbon buffer layer on the first substrate and the graphene layer on the carbon buffer layer comprises a multistep annealing process.

* * * * *

UNITED STATES PATENT AND TRADEMARK OFFICE
CERTIFICATE OF CORRECTION

| | |
|---|---|
| PATENT NO. | : 12,308,227 B2 |
| APPLICATION NO. | : 17/283625 |
| DATED | : May 20, 2025 |
| INVENTOR(S) | : Jeehwan Kim et al. |

It is certified that error appears in the above-identified patent and that said Letters Patent is hereby corrected as shown below:

In the Claims

Claim 14, at Column 11, Lines 16-19, should read:
14. The method of claim 2, wherein forming the carbon buffer layer on the first substrate and the graphene layer on the carbon buffer layer comprises sublimating a topmost surface of the first substrate.

Signed and Sealed this
Sixth Day of January, 2026

John A. Squires
*Director of the United States Patent and Trademark Office*